United States Patent [19]
Yamamoto

[11] Patent Number: 5,294,817
[45] Date of Patent: Mar. 15, 1994

[54] OUTPUT CIRCUIT FOR CHARGED TRANSFER DEVICE AND HAVING A HIGH DETECTION SENSITIVITY

[75] Inventor: Hiromasa Yamamoto, Tokyo, Japan

[73] Assignee: NEC Corporation, Tokyo, Japan

[21] Appl. No.: 41,965

[22] Filed: Apr. 2, 1993

[30] Foreign Application Priority Data

Apr. 2, 1992 [JP] Japan .................. 4-080155

[51] Int. Cl.$^5$ ............................. H01L 29/78
[52] U.S. Cl. ...................... 257/239; 257/236; 257/249; 377/60; 377/62; 377/63
[58] Field of Search ............ 257/236, 239, 249; 365/183; 377/60, 61, 62, 63

[56] References Cited

U.S. PATENT DOCUMENTS

| | | | |
|---|---|---|---|
| 4,646,119 | 2/1987 | Kosonocky | 257/239 |
| 5,192,990 | 3/1993 | Stevens | 257/239 |

FOREIGN PATENT DOCUMENTS

| | | | |
|---|---|---|---|
| 57-13764 | 1/1982 | Japan | 257/239 |
| 58-125872 | 7/1983 | Japan | 257/239 |
| 59-35472 | 2/1984 | Japan | 257/239 |
| 60-132367 | 7/1985 | Japan | 257/239 |
| 60-223161 | 11/1985 | Japan | 257/239 |

*Primary Examiner*—Ngan Ngo
*Attorney, Agent, or Firm*—Sughrue, Mion, Zinn, Macpeak & Seas

[57] ABSTRACT

In an output circuit for a charge transfer device, a floating diffusion region is connected to a source side gate electrode of a double-gate read-out field effect transistor having its drain side gate electrode connected to the drain of the read-out transistor itself. Thus, the capacitance between the gate of the read-out transistor connected to the floating diffusion region and the drain of the read-out transistor can be made small, so that the total capacitance of the floating diffusion region is correspondingly reduced, with the result that a high detection sensitivity can be realized.

4 Claims, 1 Drawing Sheet

OUTPUT CIRCUIT FOR CHARGED TRANSFER DEVICE AND HAVING A HIGH DETECTION SENSITIVITY

BACKGROUND OF THE INVENTION

1. Field of the Invention

The present invention relates to a charge transfer device, and more specifically to an output circuit for a charge transfer device.

2. Description of Related Art

Charge transfer devices are widely used in various fields, for example as a photo-electric conversion device incorporated in facsimiles and television cameras.

One typical example of conventional charge transfer devices is disclosed in U.S. Pat. No. 4,646,119, a content of which is incorporated therein by reference thereto. In brief, in typical conventional charge transfer devices, a signal charge is transferred through moving potential wells created by a multi-phase clocks, so as to fed into a floating diffusion region between an output gate and a reset gate. The signal charge temporarily accumulated in the floating diffusion is read out to an associated read-out transistor by previously resetting the reset gate so as to bring the potential of the floating diffusion region to a reset voltage, and then by closing the reset gate so as to allow the signal charge to be accumulated in the floating diffusion region from a signal charge transfer section, so that the potential of the floating diffusion region changes from the reset voltage by the amount corresponding to the signal charge. This amount of change in the potential of the floating diffusion region is detected by the associated read-out transistor and outputted as a voltage change signal from the associated read-out transistor.

Here, assuming that the signal charge is expressed by "Q" and the total capacitance of the floating diffusion region is shown by "C", the amount of change $\Delta V$ in the potential of the floating diffusion region can be defined by $\Delta V = Q/C$. Namely, the detection sensitivity can be improved by reducing the total capacitance of the floating diffusion region. Here, the total capacitance of the floating diffusion region includes a capacitance between the floating diffusion region and a substrate, a capacitance between the floating diffusion region and the output gate, a capacitance between the floating diffusion region and the reset gate, and a capacitance between a gate electrode and a drain of the read-out transistor connected to the floating diffusion region.

In the prior art, therefore, in order to realize a high detection sensitivity of the charge transfer device, the plan pattern of the output circuit for the charge transfer device is reduced in size so as to decrease the total capacitance of the floating diffusion region. However, this approach has a limit as a matter of course.

SUMMARY OF THE INVENTION

Accordingly, it is an object of the present invention to provide an output circuit for a charge transfer device, which has overcome the above mentioned defect of the conventional one.

Another object of the present invention is to provide an output circuit for a charge transfer device, having a high detection sensitivity and a simple structure.

The above and other objects of the present invention are achieved in accordance with the present invention by a charge transfer device associated with an output circuit, comprising a semiconductor substrate of a first conductivity type, a charge transfer section formed on the semiconductor substrate for transferring a signal charge, a floating diffusion formed in the semiconductor substrate adjacent to one end of the charge transfer section and for receiving the signal charge transferred through the charge transfer section, the floating diffusion being of a second conductivity type opposite to the first conductivity type, and a read-out double-gate field effect transistor having a source side gate electrode electrically connected to the floating diffusion and a drain side gate electrode formed separately from the source side gate electrode and connected to a drain of the field effect transistor itself.

In one embodiment of the charge transfer device in accordance with the present invention, the semiconductor substrate has a principal surface covered with an insulating layer, and the charge transfer section includes an array of transfer gate electrodes arranged on the insulating layer and an output gate electrode formed on the insulating layer between one end of the array of transfer gate electrodes and the floating diffusion region. Furthermore, the charge transfer device includes a reset gate electrode formed on the insulating layer at a side of the floating region opposite to the output gate electrode, and an impurity region of the second conductivity formed in such a manner that the reset gate electrode is positioned between the floating diffusion region and the impurity region. The drain side gate electrode and the drain of the field effect transistor and the impurity region are connected to a drain voltage, and a source of the field effect transistor is grounded through a resistor, so that an output signal can be outputted from source of the field effect transistor.

In one preferred embodiment, the source side gate electrode and the drain side gate electrode of the field effect transistor are separated from each other by a distance of 0.6 μm.

The above and other objects, features and advantages of the present invention will be apparent from the following description of a preferred embodiment of the invention with reference to the accompanying drawings.

DESCRIPTION OF THE PREFERRED EMBODIMENTS

Figure 1:
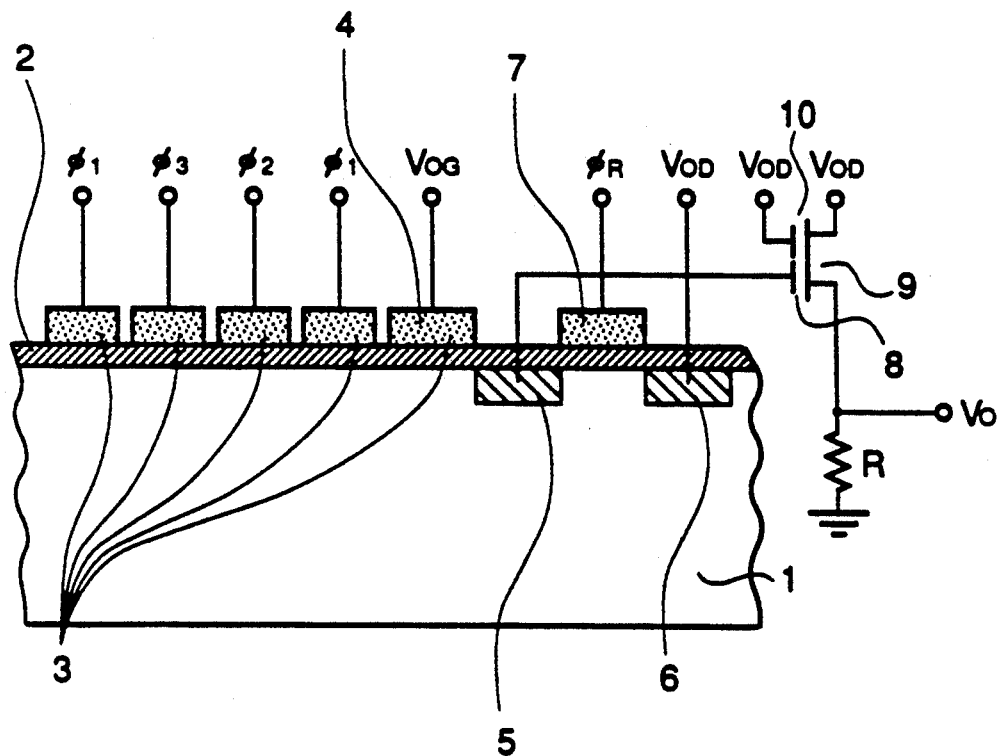
FIG. 1 is a diagrammatic section view of an embodiment of the charge transfer device having the output circuit in accordance with the present invention.

Referring to FIG. 1, there is shown a diagrammatic section view of an embodiment of the charge transfer device having the output circuit in accordance with the present invention.

The shown charge transfer device includes a P-type semiconductor substrate I having a principal surface covered with an insulating layer 2. On the insulation layer 2, a number of transfer gate electrodes 3 are located in the form of an array so as to constitute a charge transfer section driven by a three-phase clock of $\phi 1$, $\phi 2$ and $\phi 3$. Adjacent to a final one of the transfer gate electrodes 3, an output gate electrode 4 is formed on the insulation layer 2, and an N-type impurity region 5 is formed in a surface region of the substrate I adjacent to the output gate electrode 4. The N-type impurity region 5 constitutes a so called floating diffusion region. In addition, a reset gate electrode 7 is formed on the insulating layer 2 adjacent to the floating diffusion region 5, and another N-type impurity region 6 is formed in the surface region of the substrate 1 adjacent to the reset gate electrode 7 in such a manner that the reset gate electrode 7 is positioned between the floating diffusion region 5 and the N-type impurity region 6, so that a channel is created in a surface region of the substrate 1 under the reset gate electrode 7 between the floating diffusion region 5 and the N-type impurity region 6. Namely, the floating diffusion region 5, the N-type impurity region 6 and the reset gate electrode 7 functions as a field effect transistor.

The above mentioned arrangement itself is well known to persons skilled in the art, and therefore, a detailed explanation thereof will be omitted. The transfer gate electrodes 3 are supplied with three clocks $\phi 1$, $\phi 2$ and $\phi 3$ having a phase different from one another, as shown in the drawing. The three clocks clocks $\phi 1$, $\phi 2$ and $\phi 3$ are cyclicly applied to each of the transfer gate electrodes 3 so that a transfer well structure formed by the transfer gate electrodes 3 are moved toward the output gate electrode 4. The output gate electrode 4 is applied with an output gate voltage VOG, and the reset gate electrode 7 is applied with a resetting clock $\phi R$. The N-type impurity region 6 is biased to a drain voltage VOD. The clocks and the voltages applied to the transfer gate electrodes 3, the output gate electrode 4, the reset gate electrode 7 and the N-type impurity region 6 are also known to persons skilled in the art, and therefore, a further explanation thereof will be omitted.

Figure 2:
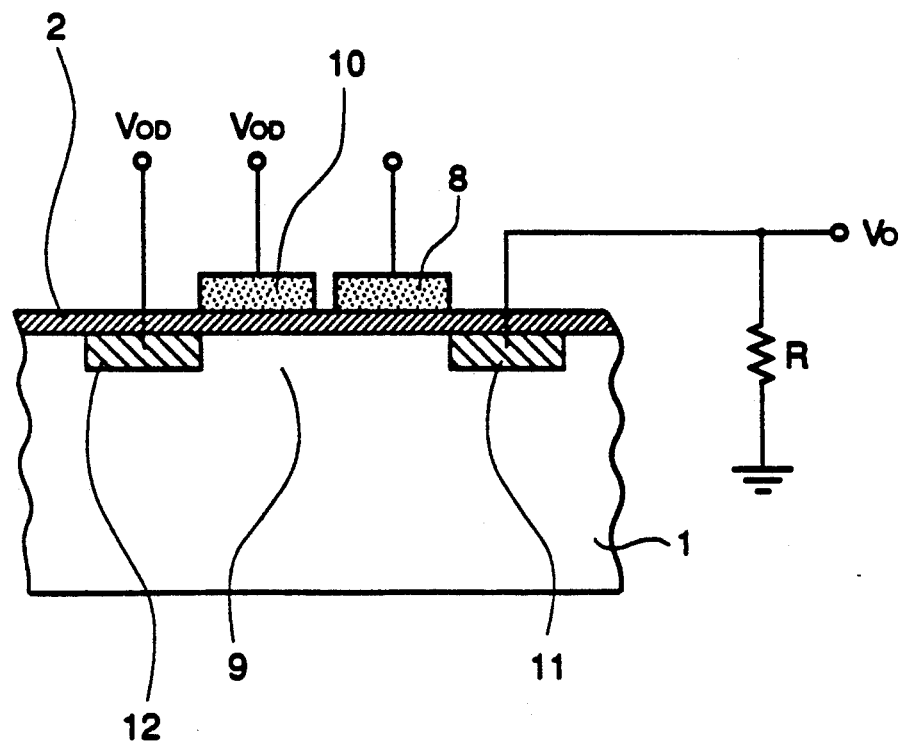
FIG. 2 is a diagrammatic section view of the output circuit of the charge transfer device shown in FIG. 1.

The floating diffusion region 5 is electrically connected to a first gate electrode 8 of a double-gate field effect transistor 9. As shown in FIG. 2, the first gate electrode 8 of the transistor 9 is near to a source region 1 1 and remote from a drain region 12, and therefore, will be called a "source side gate electrode" in the specification. In addition, a second gate electrode 10 is formed near to the drain region 12 but separately from the first gate electrode 8 by a certain distance. This gate electrode 10 will be called a "drain side gate electrode" in the specification. The second gate electrode 10 and the drain 12 of the transistor 9 are connected to the drain voltage VOD, and the source 1 1 is grounded through a resistor R. An output voltage signal Vo is picked up from the source I 1 of the transistor 9.

In the above mentioned charge transfer device, a signal charge is transferred through a moving or shifting potential well structure created by the transfer gate electrodes 3 applied with the three different clocks $\phi 1$, $\phi 2$ and $\phi 3$ in a process well known to persons skilled in the art, and the signal charge transferred by the transfer gate electrodes 3 are injected into the floating diffusion region 5. At this time, since the N-type impurity region 6 is applied with the voltage VOD, the floating diffusion region 5 is reset to a potential of the voltage VOD by applying the resetting clock $\phi R$ to the reset gate electrode 7, and then, after the resetting clock $\phi R$ becomes a low level, and therefore, after the gate 7 is closed, the signal charge transferred by the transfer gate electrodes 3 flows into the floating diffusion region 5, so that the potential of the floating diffusion region 5 changes from the potential of the voltage VOD by the amount of the signal charge. The change in the potential of the floating diffusion region 5 is applied to the first gate electrode 8 of the transistor 9, so that a corresponding voltage signal Vo is outputted from the source of the transistor 9.

In the above mentioned operation, as mentioned hereinbefore, the amount of change $\Delta V$ in the potential of the floating diffusion region 5 can be defined by $\Delta V = Q/C$ where "Q" is the signal charge and "C" is the total capacitance of the floating diffusion region 5. In the prior art charge transfer device output circuit, this total capacitance "C" of the floating diffusion region 5 includes a capacitance between the floating diffusion region and a substrate, a capacitance between the floating diffusion region and the output gate, a capacitance between the floating diffusion region and the reset gate, and a capacitance between a gate electrode and a drain of the read-out transistor connected to the floating diffusion region.

However, in the shown embodiment, the capacitance between the gate electrode 8 (source side gate electrode) and the drain region 12 of the read-out transistor 9 becomes almost zero, since the drain side gate electrode 10 is connected to the drain voltage VOD and therefore to the drain 10. However, a capacitance between the source side gate electrode 8 of the read-out transistor 9 and the drain side gate electrode 10 fixed to the drain voltage VOD is added into the total capacitance "C" of the floating diffusion region 5.

Thus, by optimizing a spacing or separating distance between the source side gate electrode 8 and the drain side gate electrode 10 of the read-out transistor 9, the total capacitance "C" of the floating diffusion region 5 can be made smaller than that of the conventional output circuit for the charge transfer device. For example, when the conventional output circuit for the charge transfer device manufactured on a P-type silicon semiconductor substrate was 0.02 pF in the total capacitance "C" of the floating diffusion region, the total capacitance "C" of the floating diffusion region could have been reduced to 0.015 pF or less by manufacturing the double gate transistor 9 having the spacing of 0.6 μm between the source side gate electrode 8 and the drain side gate electrode 10. Namely, the detection sensitivity could be improved by 30% or more.

As will be apparent from the above, since the capacitance between the gate of the read-out transistor connected to the floating diffusion region and the drain of the read-out transistor can be made small in accordance with the present invention, the total capacitance of the floating diffusion region is correspondingly reduced, with the result that a high detection sensitivity can be realized.

The invention has thus been shown and described with reference to the specific embodiments. However, it should be noted that the present invention is in no way limited to the details of the illustrated structures but changes and modifications may be made within the scope of the appended claims.

I claim:

1. A charge transfer device associated with an output circuit, comprising a semiconductor substrate of a first conductivity type, a charge transfer section formed on said semiconductor substrate for transferring a signal charge, a floating diffusion formed in said semiconductor substrate adjacent to one end of said charge transfer section and for receiving said signal charge transferred through said charge transfer section, said floating diffusion being of a second conductivity type opposite to said first conductivity type, and a read-out double-gate field effect transistor having a source side gate electrode electrically connected to said floating diffusion and a drain side gate electrode formed separately from said source side gate electrode and connected to a drain of said field effect transistor itself.

2. A charge transfer device claimed in claim 1 wherein said semiconductor substrate has a principal surface covered with an insulating layer, and said charge transfer section includes an array of transfer gate electrodes arranged on said insulating layer and an output gate electrode formed on said insulating layer between one end of said array of transfer gate electrodes and said floating diffusion, and further including a reset gate electrode formed on said insulating layer at a side of said floating diffusion opposite to said output gate electrode, and an impurity region of said second conductivity formed in such a manner that said reset gate electrode is positioned between said floating diffusion and said impurity region, said drain side gate electrode and said drain of said field effect transistor and said impurity region being connected to a drain voltage and a source of said field effect transistor being grounded through a resistor so that an output signal can be outputted from source of said field effect transistor.

3. A charge transfer device claimed in claim 2 wherein said source side gate electrode and said drain side gate electrode of said field effect transistor are separated from each other by a distance of 0.6 μm.

4. A charge transfer device claimed in claim 1 wherein said source side gate electrode and said drain side gate electrode of said field effect transistor are separated from each other by a distance of 0.6 μm.

* * * * *

UNITED STATES PATENT AND TRADEMARK OFFICE
CERTIFICATE OF CORRECTION

PATENT NO. : 5,294,817
DATED : March 15, 1994
INVENTOR(S) : Hiromasa YAMAMOTO

It is certified that error appears in the above-indentified patent and that said Letters Patent is hereby corrected as shown below:

Col. 2, line 59, delete "I" and insert --1--;

Col. 2, line 67, delete "I" and insert --1--.

Col. 3, line 25, delete "VOG" and insert --$V_{OG}$--;

Col. 3, line 28, delete "VOD" and insert --$V_{OD}$--;

Col. 3, line 45, delete "VOD" and insert --$V_{OD}$--;

Col. 3, line 45, delete "1 1" and insert --11--;

Col. 3, line 47, delete "I1" and insert --11--;

Col. 3, line 56, delete "VOD" and insert --$V_{OD}$;

Col. 3, line 57 delete "VOD" and insert --$V_{OD}$;

Col. 3, line 65 delete "VOD" and insert --$V_{OD}$.

Col. 4, line 21 delete "VOD" and insert --$V_{OD}$;

UNITED STATES PATENT AND TRADEMARK OFFICE
CERTIFICATE OF CORRECTION

PATENT NO. : 5,294,817
DATED : March 15, 1994
INVENTOR(S) : Hiromasa YAMAMOTO

It is certified that error appears in the above-indentified patent and that said Letters Patent is hereby corrected as shown below:

Col. 4, line 25 delete "VOD" and insert --$V_{\infty}$--.

Signed and Sealed this

Twenty-third Day of August, 1994

Attest:

BRUCE LEHMAN

*Attesting Officer*     *Commissioner of Patents and Trademarks*